United States Patent [19]

Horii

[11] 4,447,735

[45] May 8, 1984

[54] CHARGE-COUPLED TYPE SOLID-STATE IMAGE SENSOR

[75] Inventor: Kenju Horii, Shiga, Japan

[73] Assignee: Matsushita Electric Industrial Co., Ltd., Osaka, Japan

[21] Appl. No.: 331,686

[22] Filed: Dec. 17, 1981

[30] Foreign Application Priority Data

Dec. 19, 1980 [JP] Japan .................... 55-180726

[51] Int. Cl.$^3$ .......................................... H01L 27/10
[52] U.S. Cl. ...................................... 250/578; 357/30
[58] Field of Search .............. 250/578, 211 J; 357/30, 357/31; 307/311

[56] References Cited

U.S. PATENT DOCUMENTS 3,932,775  1/1976  Kosonocky ................. 250/578 X

Primary Examiner—William L. Sikes
Assistant Examiner—Darwin R. Hostetter
Attorney, Agent, or Firm—Burgess, Ryan & Wayne

[57] ABSTRACT

In a solid-state image sensor of the type comprising an image pickup region comprising photosensor element arrays and charge transfer arrays, a charge storage region and a read-out region, two or more charge storage arrays are provided for each of the charge transfer arrays. The number of transfer electrodes in each of the charge storage arrays can be reduced to 1/n, where n is the number of charge storage arrays for each charge transfer array, as compared with the case in which one charge storage array is provided for each charge transfer array. As a consequence, the area of the charge storage region on a chip can be considerably reduced and the reduction of the transfer charge signal can be improved; that is, the error rate can be reduced.

2 Claims, 4 Drawing Figures

CHARGE-COUPLED TYPE SOLID-STATE IMAGE SENSOR

BACKGROUND OF THE INVENTION

The present invention relates to a solid-state type charge-coupled image sensor.

The prior art charge-coupled type solid-state image sensor comprises in general an image pickup region, a charge storage region and a read-out region and one charge storage array is provided for each charge transfer array in the image pickup region so that the chip size is large and the charge-transfer efficiency is low.

SUMMARY OF THE INVENTION

One of the objects of the present invention is to provide a charge-coupled type solid-state image sensor which can be fabricated extremely compact in chip size.

Another object of the present invention is to provide a charge-coupled type solid-state image sensor which can exhibit a low charge-transfer loss.

Briefly stated, according to the present invention two or more charge storage arrays are provided in the charge storage region for each of the charge transfer arrays in the image pickup region.

BRIEF DESCRIPTION OF THE DRAWINGS

Same reference numerals are used to designate similar parts throughout the figures.

DETAILED DESCRIPTION OF THE PRIOR ART

Figure 1:
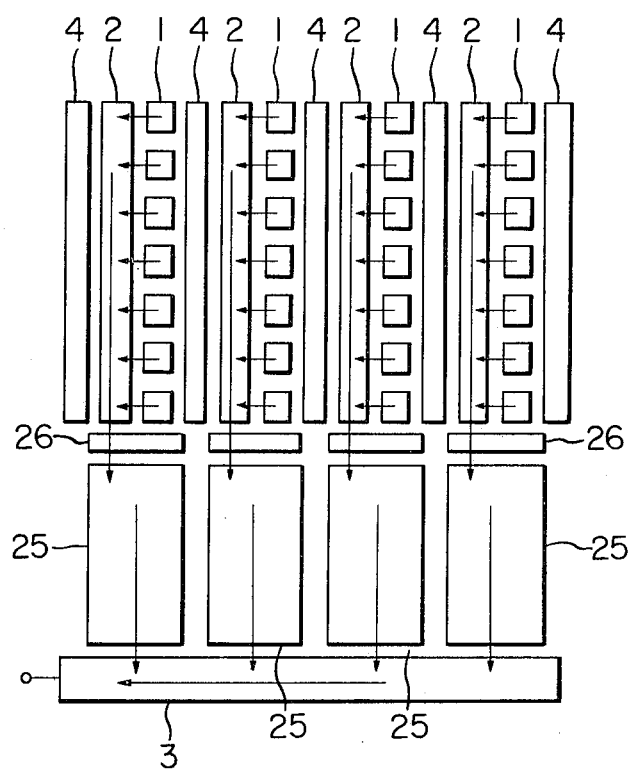
FIG. 1 is a schematic view showing the construction of a prior art solid-state image sensor.

In FIG. 1 is shown a prior art charge-coupled device (CCD) type solid-state image sensor comprising a plurality of arrays of photosensor elements 1, charge transfer arrays 2, overflow drain arrays 4, storage regions 25 for storing the signal charge from the photosensor element arrays 1 and a read-out region 3 for sequentially reading out the signal charge stored in the storage regions 25.

The photosensor element arrays 1, the charge transfer arrays 2 and the overflow drain regions 4 constitute an image pickup region and generally the charge transfer arrays 2 are optically shielded.

When the light falls on the photosensor element array 1, a photocharge is generated and accumulated for a predetermined integration time. Thereafter, the charge is transferred into the charge transfer array 2 and the almost immediately into the charge storage region 25. The signal charge which is stored in the charge storage region 25 and corresponds to the video signal for one horizontal video line is then transferred into the read-out region 3. While the signal charge is being read out from the read-out region 3, a fresh charge is created and accumulated in the photosensor element array 1. After the signal charge has been completely transferred from the charge storage region 25 into the read-out region 3, the accumulated charge is transferred again into the charge storage region 25 in the manner described above.

Figure 2:
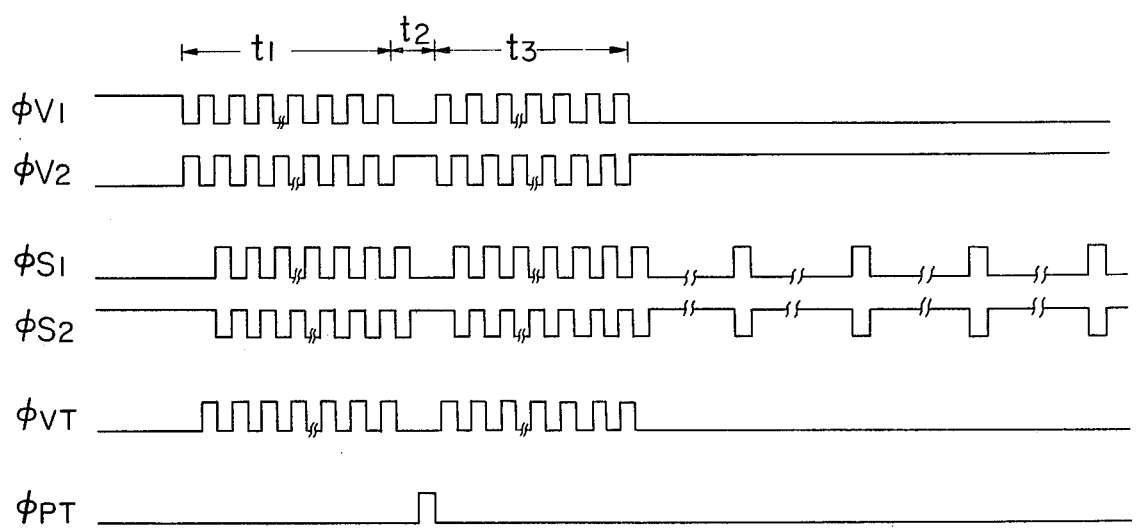
FIG. 2 shows pulse waveforms used to explain the mode of operation thereof.

The above-described operation of the prior art CCD type solid-state image sensor is carried on in response to the pulse voltages as shown in FIG. 2. The voltage pulses $\phi_{V1}$, $\phi_{V2}$, $\phi_{S1}$ and $\phi_{S2}$ are applied to the transfer electrodes in the image pickup region and the charge storage regions 25. The pulse voltage $\phi_{PT}$ is applied to the gate electrodes so as to transfer the signal charge from the photosensor element array 1 to the corresponding charge transfer array 2 and the pulse voltage $\phi_{VT}$ is applied to the transfer electrodes 26 so as to transfer the signal charge in the charge transfer arrays 2 into their corresponding charge storage regions 25.

In response to the voltage pulses applied during a time interval $t_1$, the "smearing" charge in the charge transfer array 2 is swept away through the charge storage region 25. During a time interval $t_2$, in response to the voltage pulse $\phi_{PT}$ applied to the gate electrodes, the signal charge accumulated in the photosensor element array 1 is transferred into the charge transfer array 2. In the next cycle $t_3$, the voltage pulse $\phi_{VT}$ is applied to the transfer electrode 26 so that the signal charge is transferred from the charge transfer array 2 into the charge storage region 25. During the integration time the pulse $\phi_{PT}$ is not present. The charge storage region includes a repetitive structure of transfer electrodes the number of which is equal to that of the photosensor elements in each array so that all the signal charge generated and accumulated in the photosensor element array 1 can be transferred into and stored in the corresponding charge storage region 25. As a result, the area of all the charge storage regions 25 becomes almost equal to the area of the image pickup region and the total area of the image sensor becomes almost twice as large as the image pickup region.

As is well known in the art, the increase in chip size will inevitably result in adverse effects on yield. The size of the image pickup region is dependent upon the type of associated optical system. It follows that in order to reduce the size of photosensor elements, the charge storage regions 25 must be reduced in size. To this end, the transfer electrodes which constitute the charge storage region 25 must be reduced in size, but the signal charge storage capacity in turn is decreased. This decrease in storage capacity can be partially compensated by applying to the charge storage region 25 a driving voltage higher than that applied to the image pickup region, but it is apparent that there exist limits on the increase of the driving voltage. In addition, the fabrication of solid-state image sensor chips with such small transfer electrodes will become very difficult. As described previously, the sum of the storage capacity of all the charge storage regions 25 must be such that all the signal charge generated and accumulated in the image pickup region can be transferred into and stored in the charge storage regions 25 without causing any overflow.

DESCRIPTION OF THE PREFERRED EMBODIMENTS

The present invention was made to overcome the above and other problems encountered in the prior art CCD type solid-state image sensor and has for its object to provide a solid-state image sensor which can be made extremely compact in size as compared with the prior art solid-state image sensor because of the drastic reduction in size of the charge storage regions.

Figure 3:
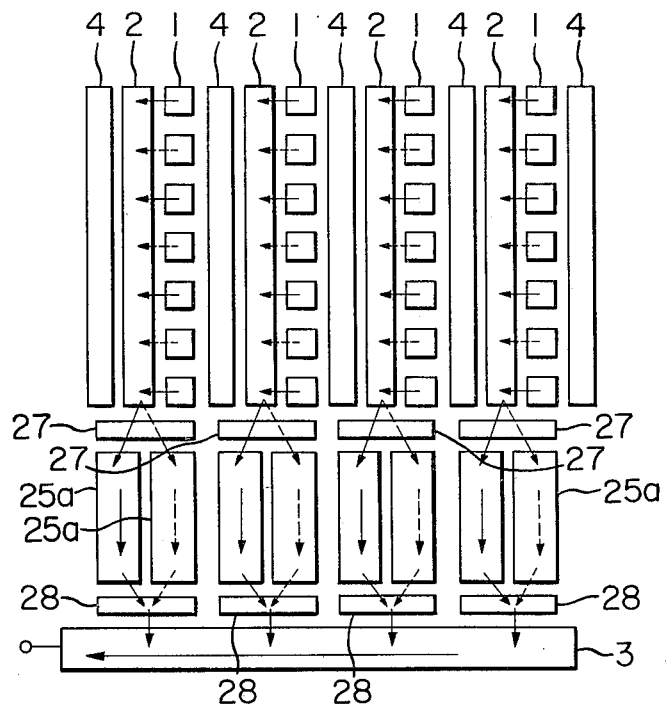
FIGS. 3 and 4 are schematic views, respectively, showing the constructions of first and second embodiments of the present invention.

First Embodiment, FIG. 3

In FIG. 3 is shown a first embodiment of the present invention which, as with the prior art solid-state image sensor described above with reference to FIGS. 1 and 2, comprises the photosensor element arrays 1, the charge transfer arrays 2, the overflow charge drain arrays 4 and the read-out region 3, but the arrangement of charge storage regions 25 is fundamentally different from that of the charge storage regions in the prior art solid-state image sensor as described in detail below.

For every one of the charge transfer arrays 2 in the image pickup region there are provided two charge storage arrays 25 in parallel with each other. In the image pick-up region, a unit pattern comprising the photosensor element array 1, the charge transfer array 2 and the overflow drain array 4 is repeated widthwise, but in the charge storage region the charge storage arrays 25 are arrayed in column so that a set of two juxtaposed charge storage arrays has a storage capacity sufficient to receive and store all the signal charge from the photosensor element array 1.

In response to a control signal or pulse applied to a switching gate electrode 27, the transfer of the signal charge from the charge transfer array 2 is switched between the first (left) charge storage array and the second (right) charge storage array as indicated by the solid-like and dotted-line arrows. In response to a control signal or pulse applied to a transfer control gate electrode 28, the signal charge stored in the first and second charge storage arrays 25 is transferred to the read-out region 3 in the first-in-first-out mode.

In operation, the signal charge generated and accumulated in the photosensor element array 1 is transferred into the corresponding charge transfer array 2 and then almost immediately transferred into the first and second charge storage arrays in a serial mode as described above. Thereafter, the signal charge is transferred from the first and second charge storage arrays 25 into the read-out region 3 in the serial and first-in-first-out mode as described previously.

In the image pickup region comprising the photosensor element arrays 1, the charge transfer arrays 2 and the overflow drain arrays 4, the charge transfer arrays 2 are optically shielded. The charge storage arrays 25 and the read-out region 3 are also optically shielded.

Figure 4:
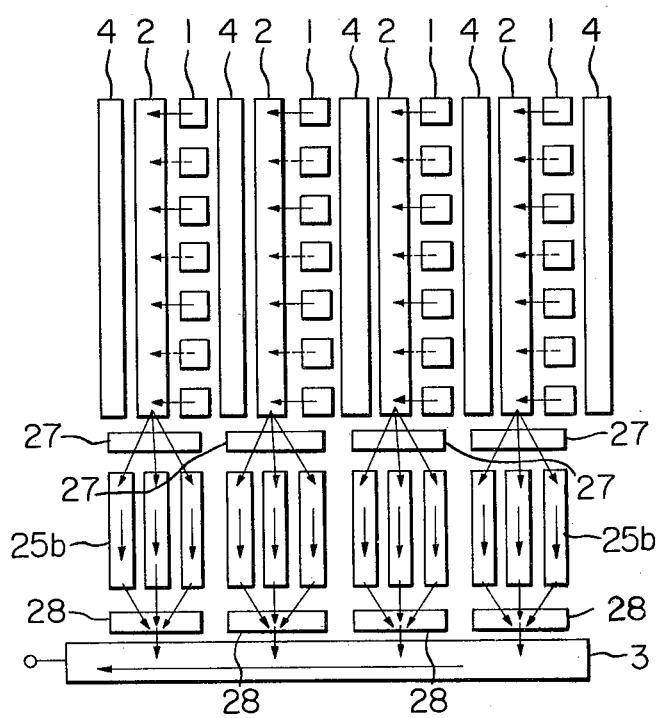

Second Embodiment, FIG. 4

While in the first embodiment, two charge storage arrays 25 are provided for every one of the charge transfer arrays 2, three charge storage arrays 25 are provided for every one of the charge transfer arrays 2 as shown in FIG. 4. However, it is to be understood that more than three charge storage arrays can be provided for each of the charge transfer arrays 2.

In summary, according to the present invention, two or more charge storage arrays 25 are provided for each of the charge transfer arrays 2 so that the height or the vertical length of the charge storage region (containing the charge storage arrays 25) can be reduced almost in inverse proportion of the number n of the charge storage arrays 25 provided for each of the charge transfer arrays 2. That is, in the case of the first embodiment where the number n is 2, the vertical length can be reduced almost one half of the image pickup region. Consequently, the charge storage region can be drastically reduced in size. In addition, the number of transfer electrodes in each of the charge storage arrays 25 can be reduced almost in inverse proportion to the number n. For instance, the number of transfer electrodes in each of the charge storage arrays 25 in the first embodiment where the number n is 2 becomes one half of the number of those in each of the charge storage arrays in the prior art solid-state image sensor as shown in FIG. 1. As a consequence, the transmission or transfer losses through the charge storage arrays 25 can be reduced. So far, the conventional solid-state image sensors have exhibited high error rates because of the degradation in the column transfer efficiency, but according to the present invention the error rate can be improved by 50% or more.

What is claimed is:

1. A charge-coupled type solid-state image sensor, comprising a semiconductor substrate having formed thereon:
    an image pickup region comprising photosensor element arrays and charge transfer arrays coupled thereto for generating and accumulating signal charge in response to a light image impinging on said photosensor element arrays;
    a plurality of charge storage regions each comprising at least two parallel-connected charge storage arrays;
    first transfer switching gate means interposed between said charge transfer arrays and said charge storage region for coupling charge from each charge transfer array to a corresponding one of each of said charge storage arrays so that said signal charge is sequentially transferred into the charge storage arrays of each said corresponding charge storage region, i.e. into one array of each corresponding charge storage region at a time;
    a readout region; and
    second transfer switching gate means coupled between said charge storage regions and said readout region for sequentially transferring signal charge from each array of a corresponding charge storage region to said readout region in a first-in-first-out manner, so that signal charge is read out from one charge storage array of each corresponding charge storage region while signal charge remains in at least one other charge storage array of said corresponding charge storage region.

2. A charge-coupled type solid-state image sensor according to claim 1, wherein at least one of said charge storage regions comprises at least 3 parallel-connected charge storage arrays.

* * * * *